United States Patent
Shi et al.

(10) Patent No.: US 7,224,722 B2
(45) Date of Patent: May 29, 2007

(54) DIRECT CONVERSION RF TRANSCEIVER WITH AUTOMATIC FREQUENCY CONTROL

(75) Inventors: Zhongming Shi, San Diego, CA (US); Ahmadreza Rofougaran, Marina Del Ray, CA (US); Arya Reza Behzad, Poway, CA (US)

(73) Assignee: Broadcom Corporation, Irvine, CA (US)

(*) Notice: Subject to any disclaimer, the term of this patent is extended or adjusted under 35 U.S.C. 154(b) by 702 days.

(21) Appl. No.: 10/255,378

(22) Filed: Sep. 26, 2002

(65) Prior Publication Data

US 2003/0138034 A1 Jul. 24, 2003

Related U.S. Application Data

(63) Continuation-in-part of application No. 10/052,870, filed on Jan. 18, 2002.

(51) Int. Cl.
*H04B 1/38* (2006.01)
*H04L 5/16* (2006.01)

(52) U.S. Cl. .................. 375/219; 375/222; 375/259; 375/316; 375/344; 375/346; 455/73; 710/1

(58) Field of Classification Search ............... 375/219, 375/222, 259, 316, 344, 346; 370/276; 455/73; 710/1
See application file for complete search history.

(56) References Cited

U.S. PATENT DOCUMENTS

| | | | | |
|---|---|---|---|---|
| 4,573,023 | A * | 2/1986 | Cok et al. .................. | 331/1 A |
| 5,625,324 | A * | 4/1997 | Hsu et al. .................. | 331/2 |
| 6,223,061 | B1 * | 4/2001 | Dacus et al. ............... | 455/574 |
| 6,366,622 | B1 * | 4/2002 | Brown et al. .............. | 375/322 |
| 6,463,266 | B1 * | 10/2002 | Shohara ..................... | 455/196.1 |
| 6,813,485 | B2 * | 11/2004 | Sorrells et al. ............. | 455/313 |
| 2001/0051507 | A1 * | 12/2001 | Ichihara .................... | 455/86 |
| 2002/0193084 | A1 * | 12/2002 | Lim et al. .................. | 455/118 |
| 2003/0003887 | A1 * | 1/2003 | Lim et al. .................. | 455/147 |
| 2003/0013428 | A1 * | 1/2003 | Marques et al. ........... | 455/259 |
| 2003/0021367 | A1 * | 1/2003 | Smith ........................ | 375/346 |
| 2003/0045263 | A1 * | 3/2003 | Wakayama et al. ........ | 455/323 |

(Continued)

FOREIGN PATENT DOCUMENTS

DE  195 28 069 A1  2/1997

OTHER PUBLICATIONS

Mammion P., "Bluetooth Transceiver Consumes Under 20 mW", Jan. 10, 2000, Electronic Design, Penton Media, Cleveland, OH, US, p. 37, XP000945764, ISSN: 0013-4872.

(Continued)

*Primary Examiner*—David C. Payne
*Assistant Examiner*—Erin M. File
(74) *Attorney, Agent, or Firm*—Garlick Harrison & Markison; James A. Harrison

(57) ABSTRACT

A single chip radio transceiver includes circuitry that enables received wideband RF signals to be down-converted to baseband frequencies and baseband signals to be up-converted to wideband RF signals prior to transmission without requiring conversion to an intermediate frequency. The circuitry includes a low noise amplifier, automatic frequency control circuitry for aligning a local oscillation frequency with the frequency of the received RF signals, signal power measuring circuitry for measuring the signal to signal and power ratio and for adjusting frontal and rear amplification stages accordingly, and finally, filtering circuitry to filter high and low frequency interfering signals including DC offset.

42 Claims, 12 Drawing Sheets

U.S. PATENT DOCUMENTS

2003/0139162 A1* 7/2003 Anand et al. ............... 455/255

OTHER PUBLICATIONS

Tang Jing Jung, et al, "A 2.4 GHZ Four Port Mixer for Direct Conversion Used in Telemetering", May 6, 2001, ISCAS 2001, Proceedings of the 2001 IEEE International Symposium on Circuits and Systems, Sydney, Australia, May 6-9, 2001, IEEE International Symposium on Circuits and Systems, New York, NY, IEEE, US, pp. 378-381, XP010541872, ISBN: 0-7803-6685-9.

* cited by examiner

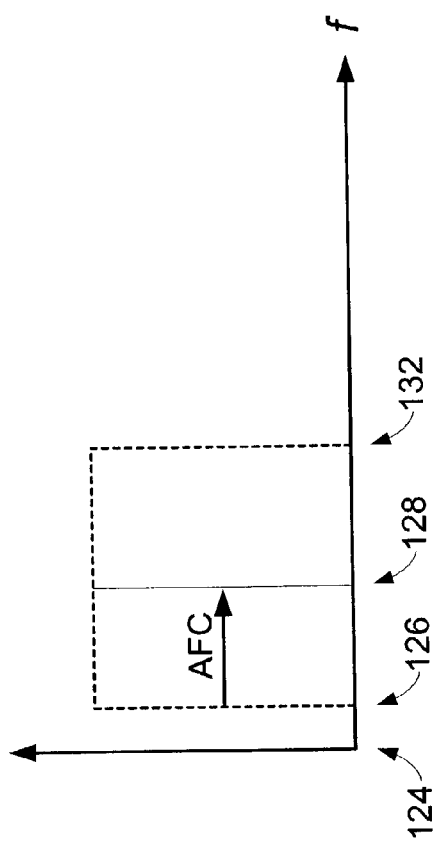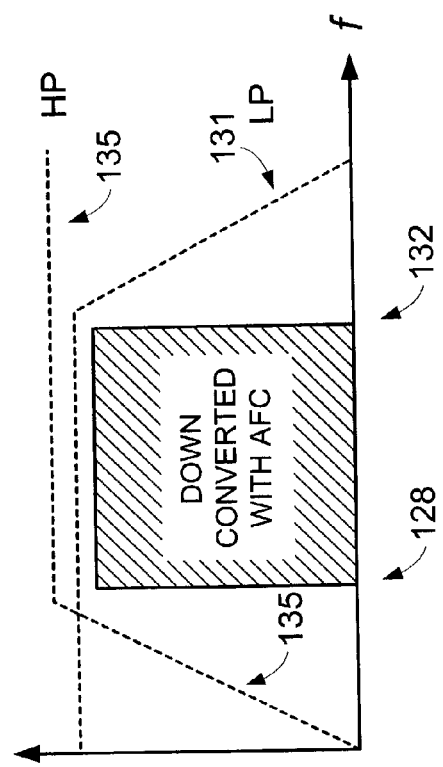

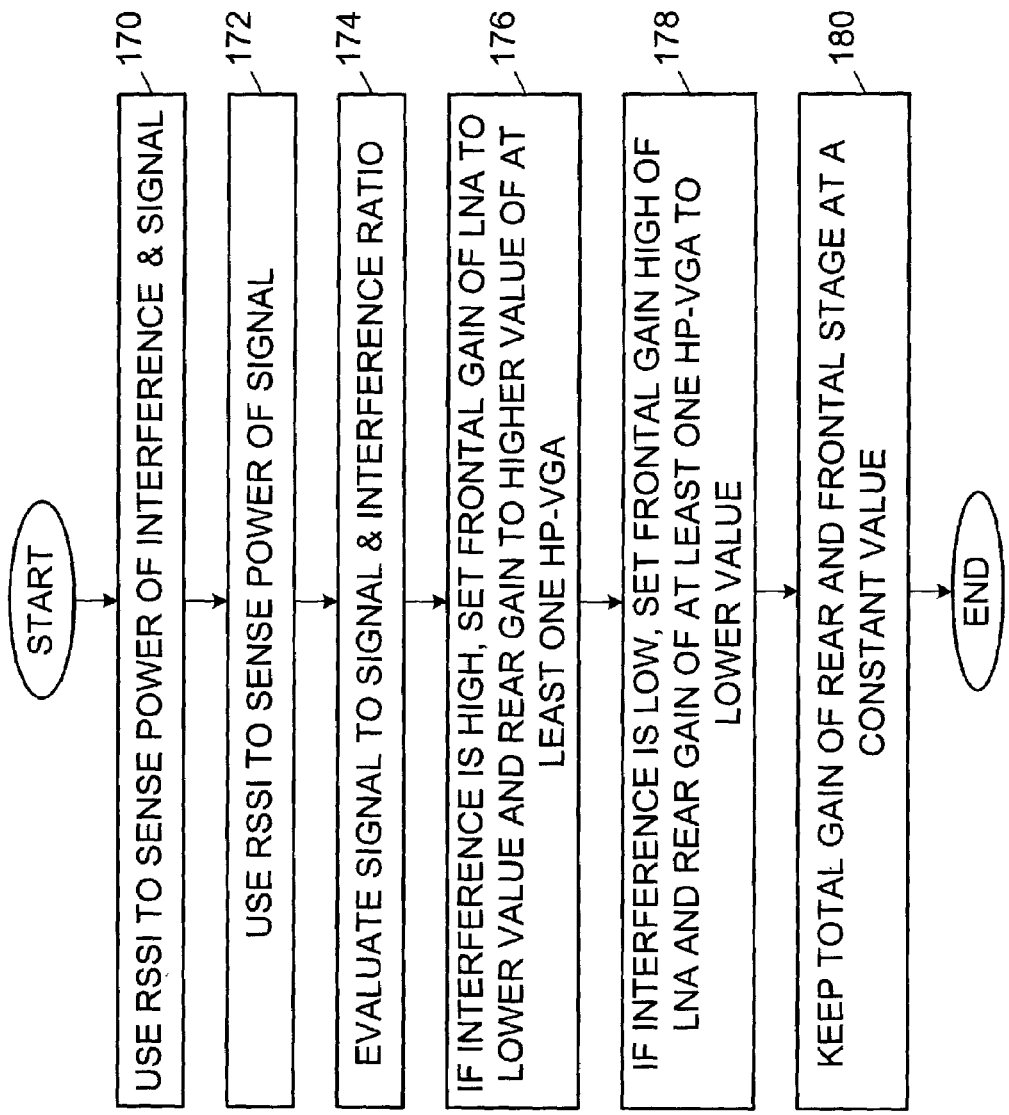

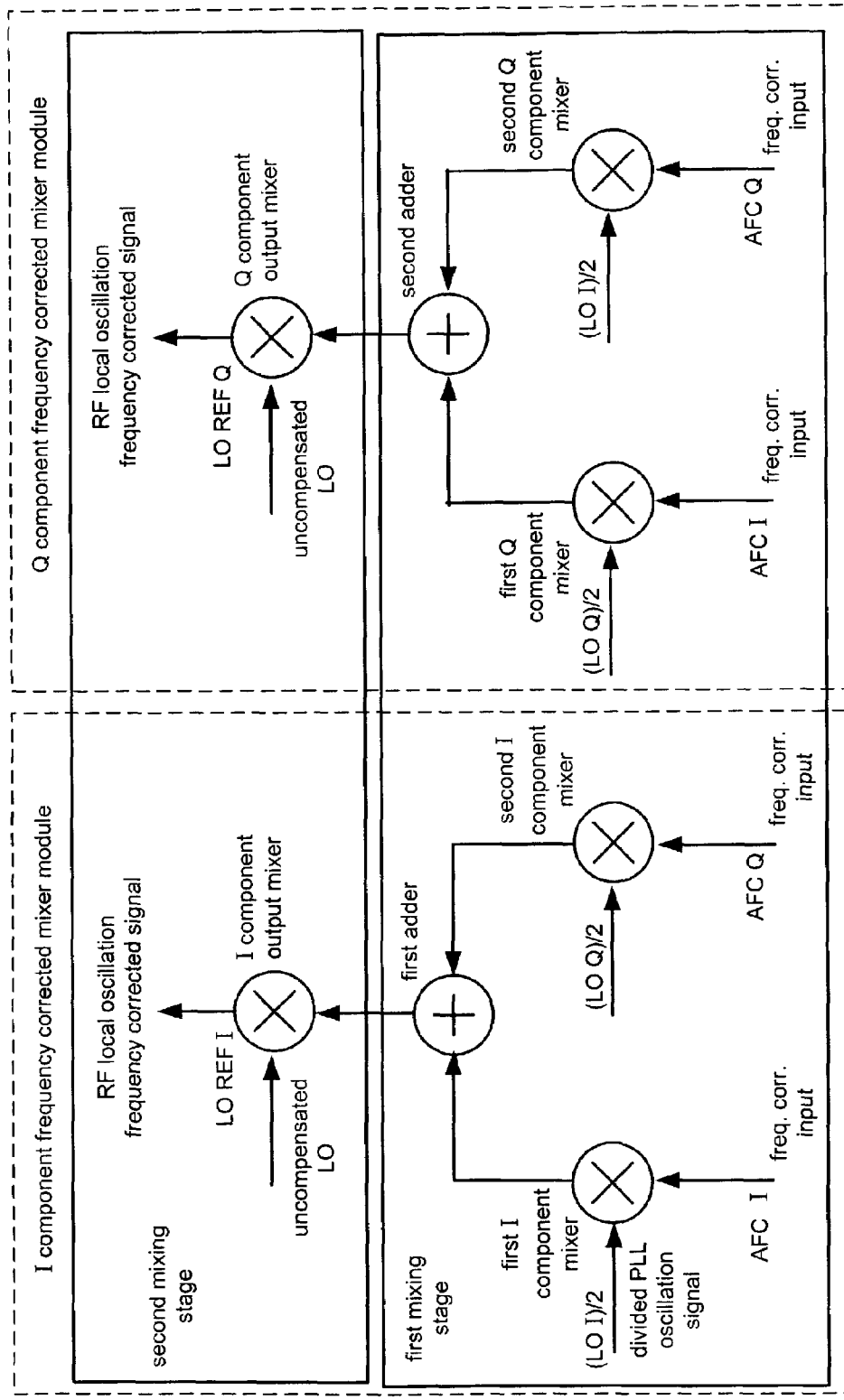
FIG. 11  frequency correction stage

DIRECT CONVERSION RF TRANSCEIVER WITH AUTOMATIC FREQUENCY CONTROL

CROSS REFERENCE TO RELATED APPLICATION

This application claims priority to, and is a continuation-in-part of, U.S. Regular Application Ser. No. 10/052,870, filed Jan. 18, 2002, the disclosure of which is incorporated herein by reference.

BACKGROUND

1. Technical Field

The present invention relates to wireless communications and, more particularly, wideband wireless communication systems.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. As used herein, the term "low IF" refers to both baseband and intermediate frequency signals. A filtering stage filters the low IF signals to attenuate unwanted out of band signals to produce a filtered signal. The data recovery stage recovers raw data from the filtered signal in accordance with the particular wireless communication standard.

To carry out filtering at the intermediate frequencies, surface acoustic wave filters (SAW) are commonly used. The SAW filters have the drawback, however, of being bulky, heavy and expensive. Additionally, the SAW filters require low impedance matching thereby resulting in high power consumption. Because they are often powered by battery, portable wireless communication devices are not readily adaptable for such systems in that they are required to be inexpensive, light and consume lower amounts of power. Thus, there is a need to design transceiver systems that eliminate the use of intermediate frequency filters.

An alternate approach to using a higher intermediate frequency that requires the SAW filters is to convert the RF signal to an intermediate frequency sufficiently low to allow the integration of on-chip channel selection filters. For example, some narrow band or low data rate systems, such as Bluetooth, use this low intermediate frequency design approach.

One problem of using low intermediate frequencies, however, is to satisfy the image rejection requirements for the systems. The image rejection requirement for the down-conversion is hard to meet and is usually limited to about −40 dB. Thus, this low intermediate frequency approach is limited for narrow band or low data rate systems. Wide band or high data rate systems require an intermediate frequency that is not low enough for the integration of channel selection filters given the technology that is available today for semiconductor processes. There is a need, therefore, for a wireless transceiver system that allows for full integration on-chip of circuit designs that support high data rate and wideband communications. Stated differently, there is a need for wireless transceiver systems formed on an integrated circuit that have the capability to convert between baseband and a specified RF band in a single step to avoid the image rejection problem discussed above.

Active mixers used in direct conversion radios as well as radios that employ an intermediate conversion step, typically comprise input transconductance elements, switches and an output load. These active mixers often have varying output signal characteristics due to environmental conditions, such as temperature, and process and manufacturing variations. These varying output signal characteristics can, for example, result in a mixer producing an errant local oscillation signal that affects the accuracy of an output signal's frequency. Having inaccurate output frequencies can result in many undesirable outcomes, including unwanted signal filtering by a downstream filter. What is needed, therefore, is a mixer for use in circuitry for up-converting and down-converting signals that reduces or eliminates the effects of frequency drift that is often present.

SUMMARY OF THE INVENTION

One embodiment of the present invention includes a single chip radio transceiver which includes circuitry that enables received wideband RF signals to be down-converted to baseband frequencies and baseband signals to be up-converted to wideband RF signals prior to transmission without requiring conversion to an intermediate frequency. Accordingly, image rejection problems are not encountered and large, expensive and heavy SAW filters are not required as a part of the signal processing. The present invention includes a radio transceiver that includes a mixer module that produces frequency compensated local oscillation signals for mixing with a received RF signal to down-convert the received RF to baseband (or to a low intermediate frequency (low IF) signal) and for mixing a baseband or a low IF to up-convert to RF signals for transmission.

In one embodiment of the invention, a down-converted baseband signal is produced to a baseband processor that determines how much frequency compensation is required for a local oscillation signal to result in the center frequency of the down-converted baseband signals to be equal to an expected center frequency value. The baseband processor produces I and Q component frequency correction outputs to first and second mixing stages of a mixer module to produce I and Q frequency corrected components for down-converting a received RF signal. Accordingly, a received RF signal is down-converted to a baseband signal having a center frequency that is equal to or approximately equal to an expected center frequency value.

More specifically, an RF signal is initially received in a receiver, is amplified and is produced to a mixer for down-conversion with an uncompensated local oscillation signal. The down-converted baseband signal is then produced to a baseband processor. The baseband processor thereafter determines an amount of frequency correction that is necessary for the I and Q components of the received RF signal. Accordingly, in a frequency correction stage, the invention includes receiving an I component frequency correction input and a Q component frequency correction input originated from the baseband processor. The frequency correction stage further receives a first local oscillation signal and mixes the first local oscillation signal with the I component frequency correction input in a first mixer to produce first and second tones. Thereafter, a second local oscillation signal is received and is mixed with the Q component frequency correction input in a second mixer to produce first and third tones. The outputs of the first and second mixers are then received by an adder and are summed to produce a summed output. The summed output is equal to twice the magnitude of the first tone wherein the second and third output tones are of opposite magnitude and cancel each other. The output of the adder is then produced to a second mixing stage. The second mixing stage then receives an uncompensated local oscillation signal and mixes the summed output with the uncompensated local oscillation signal to produce a frequency corrected local oscillation signal.

The present invention includes circuitry for achieving the above described process to down-convert a received RF signal to a baseband frequency signal having an expected center channel frequency. Similarly, the mixing module and methods therefor further may be used up up-convert a baseband or low IF signal to a desired RF channel having a desired RF channel center frequency. Other aspects of the present invention will become apparent with further reference to the drawings and specification, which follow.

BRIEF DESCRIPTION OF THE DRAWINGS

A better understanding of the present invention can be obtained when the following detailed description of the preferred embodiment is considered with the following drawings, in which:

FIGS. 4A and 4B illustrate frequency response curves that are realized by the present inventive system or transceiver;

FIG. 7 is a flowchart that illustrates a method for amplifying a received signal in a transceiver according to one embodiment of the present invention;

FIG. 11 is a functional schematic block diagram of a frequency correction stage formed according to one embodiment of the present invention;

DETAILED DESCRIPTION OF THE DRAWINGS

Figure 1:
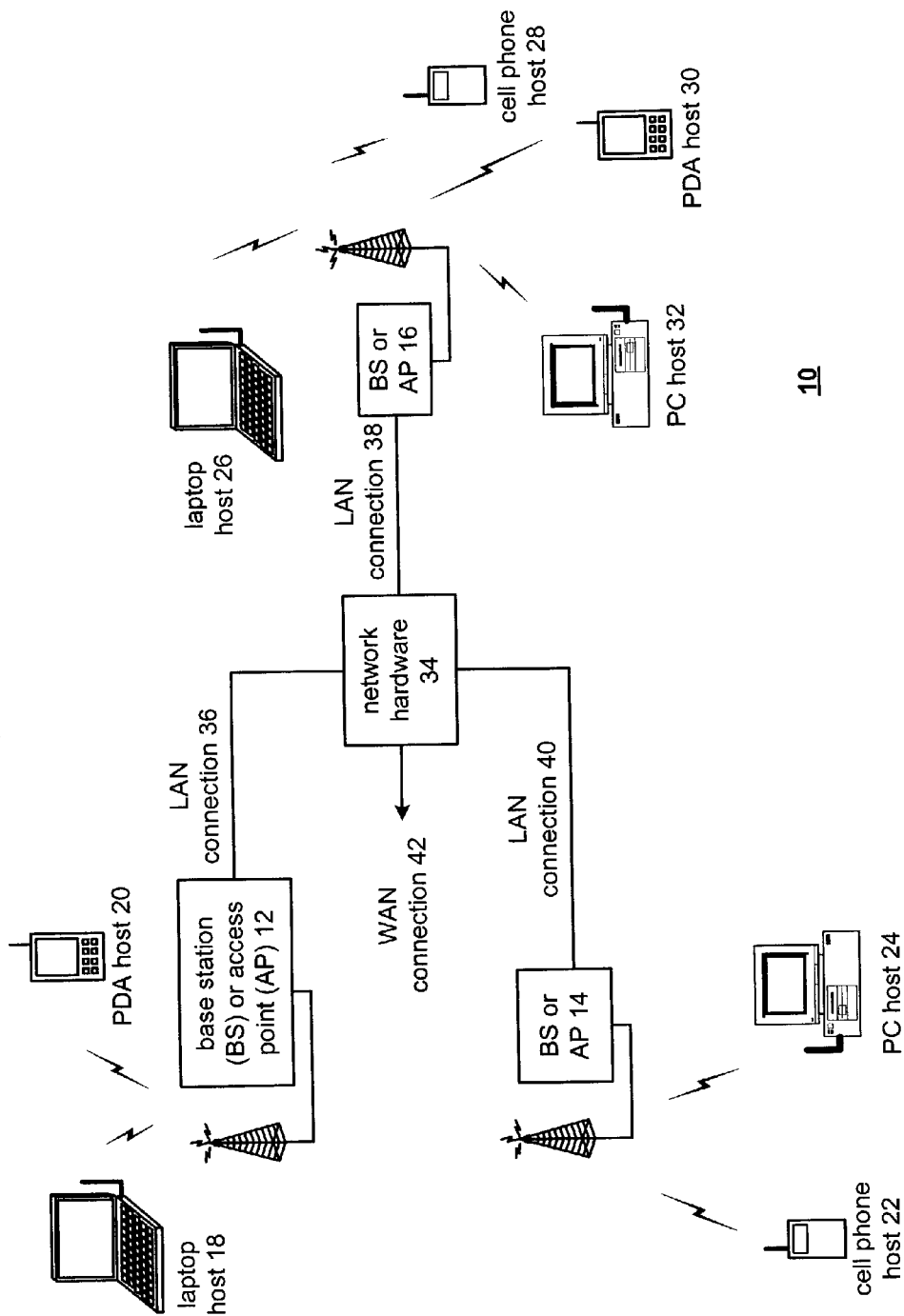
FIG. 1 is a functional block diagram illustrating a communication system that includes a plurality of base stations and/or access points, a plurality of wireless communication devices and a network hardware component.

FIG. 1 is a functional block diagram illustrating a communication system 10 that includes a plurality of base stations or access points (AP) 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or AP 12-16 are operably coupled to the network hardware component 34 via local area network (LAN) connections 36, 38 and 40. The network hardware component 34, which may be a router, switch, bridge, modem, system controller, etc., provides a wide area network connection 42 for the communication system 10. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

Figure 2:
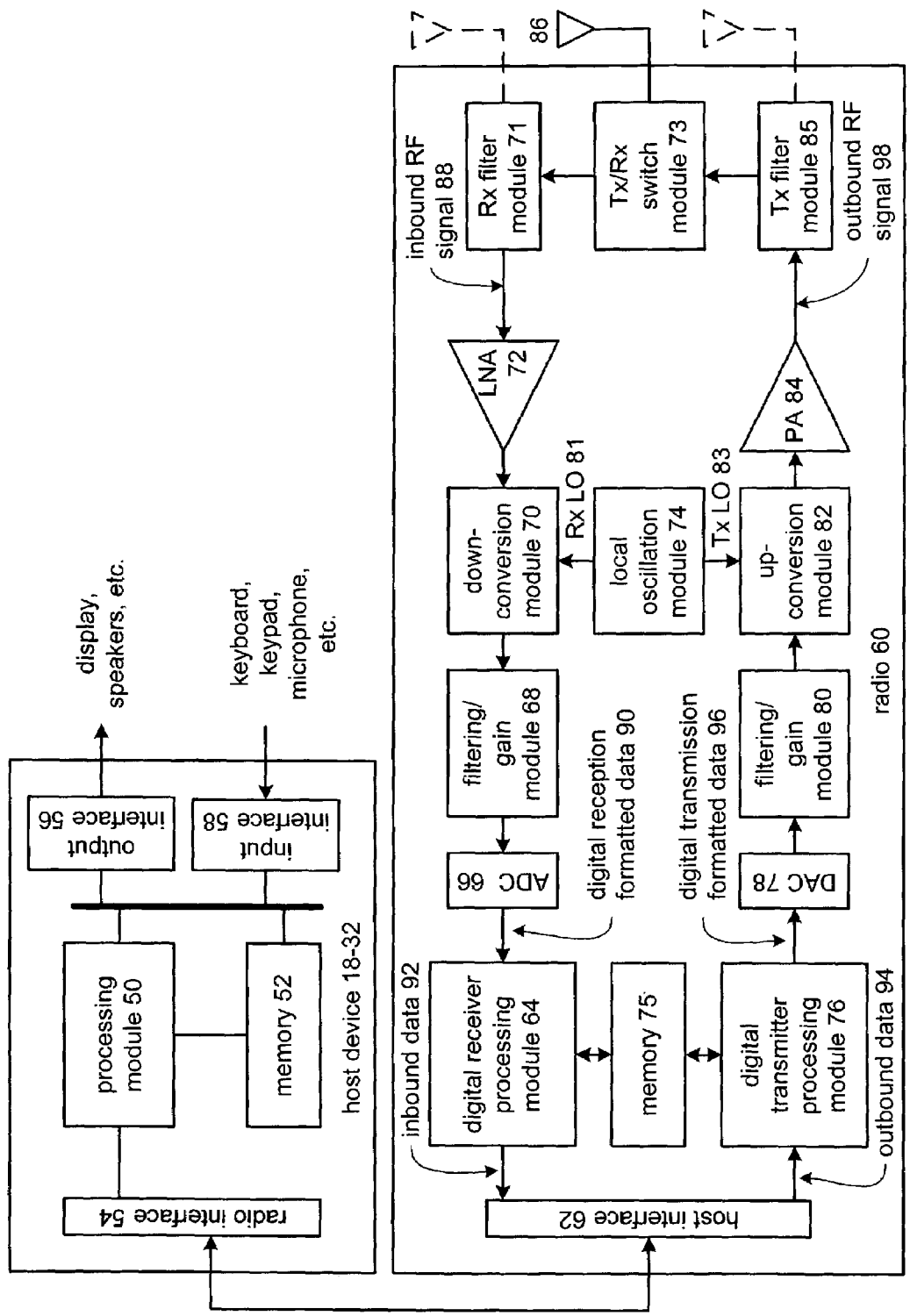
FIG. 2 is a schematic block diagram illustrating a wireless communication device as a host device and an associated radio.

FIG. 2 is a schematic block diagram illustrating a wireless communication device 18-32 as a host device and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host wireless communication device 18-32 includes a processing module 50, a memory 52, a radio interface 54, an input interface 58 and an output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a digital receiver processing module 64, an analog-to-digital converter 66, a filtering/gain module 68, a down-conversion module 70, a low noise amplifier 72, receiver filter module 71, a transmitter/receiver (Tx/RX) switch module 73, a local oscillation module 74, a memory 75, a digital transmitter processing module 76, a digital-to-analog converter 78, a filtering/gain module 80, an IF mixing up-conversion module 82, a power amplifier 84, a transmitter filter module 85, and an antenna 86. The antenna 86 is shared by the transmit and receive paths as regulated by the Tx/Rx switch module 73. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, modulation. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the digital receiver processing module 64 and/or the digital transmitter processing module 76 executes, operational instructions corresponding to at least some of the functions illustrated herein.

In operation, the radio 60 receives outbound data 94 from the host wireless communication device 18-32 via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, etc.) to produce digital transmission formatted data 96. The digital transmission formatted data 96 will be a digital baseband signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog baseband signal prior to providing it to the up-conversion module 82. The up-conversion module 82 directly converts the analog baseband signal, or low IF signal, into an RF signal based on a transmitter local oscillation 83 provided by local oscillation module 74. The power amplifier 84 amplifies the RF signal to produce an outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch module 73, where the Rx filter module 71 bandpass filters the inbound RF signal 88. The Rx filter module 71 provides the filtered RF signal to low noise amplifier 72, which amplifies the inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation signal 81 provided by local oscillation module 74. The down-conversion module 70 provides the inbound low IF signal or baseband signal to the filtering/gain module 68. The filtering/gain module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host wireless communication device 18-32 via the radio interface 54.

As one of average skill in the art will appreciate, the wireless communication device of FIG. 2 may be implemented using one or more integrated circuits. For example, the host device may be implemented on a first integrated circuit, while the digital receiver processing module 64, the digital transmitter processing module 76 and memory 75 are implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver processing module 64 and the digital transmitter processing module 76 may be a common processing device implemented on a single integrated circuit. Further, memory 52 and memory 75 may be implemented on a single integrated circuit and/or on the same integrated circuit as the common processing modules of processing module 50, the digital receiver processing module 64, and the digital transmitter processing module 76.

The wireless communication device of FIG. 2 is one that may be implemented to include either a direct conversion from RF to baseband and baseband to RF or for a conversion by way of a low intermediate frequency. In either implementation, however, for an up-conversion module 82 and a down-conversion module 70, it is required to provide accurate frequency conversion. For the down-conversion module 70 and up-conversion module 82 to accurately mix a signal, however, it is important that the local oscillation module 74 provide an accurate local oscillation signal for mixing with the baseband or RF by the up-conversion module 82 and down-conversion module 70, respectively. Accordingly, the local oscillation module 74 includes circuitry for adjusting an output frequency of a local oscillation signal provided therefrom. As will be explained in greater detail, below, the local oscillation module 74 receives a frequency correction input that it uses to adjust an output local oscillation signal to produce a frequency corrected local oscillation signal output. While one embodiment of the present invention includes local oscillation module 74, up-conversion module 82 and down-conversion module 70 that are implemented to perform direct conversion between baseband and RF, it is understand that the principles herein may also be applied readily to systems that implement an intermediate frequency conversion step at a low intermediate frequency.

Figure 3A:
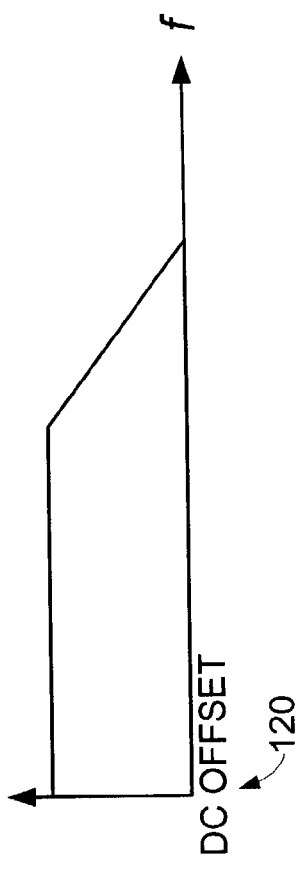
FIGS. 3A, 3B, 3C and 3D are frequency response curves
Figure 3B:
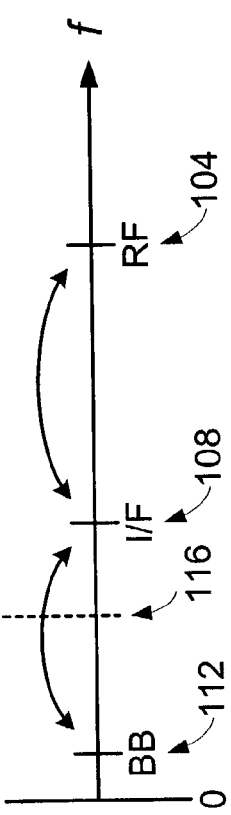
Figure 3C:
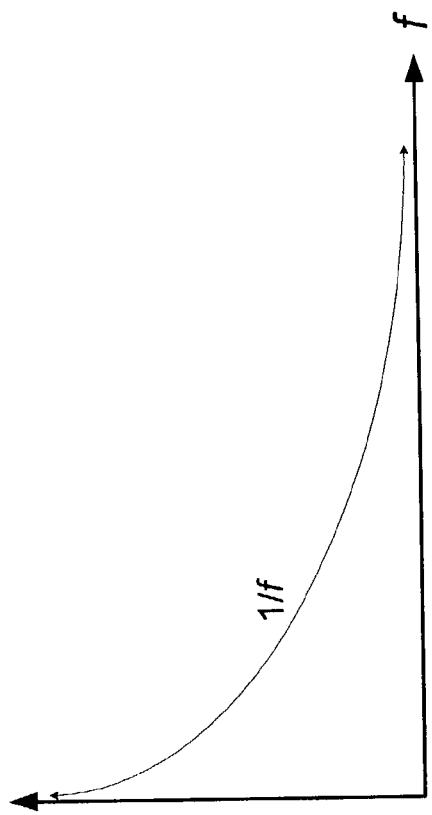
Figure 3D:
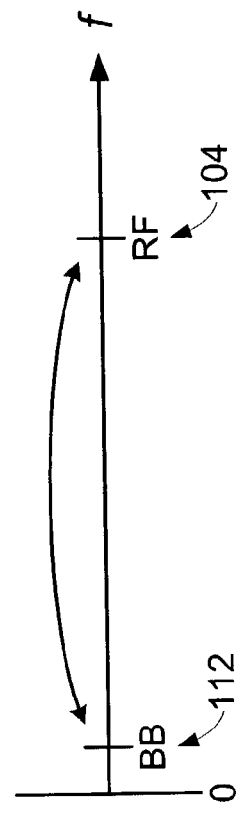
Figure 3E:
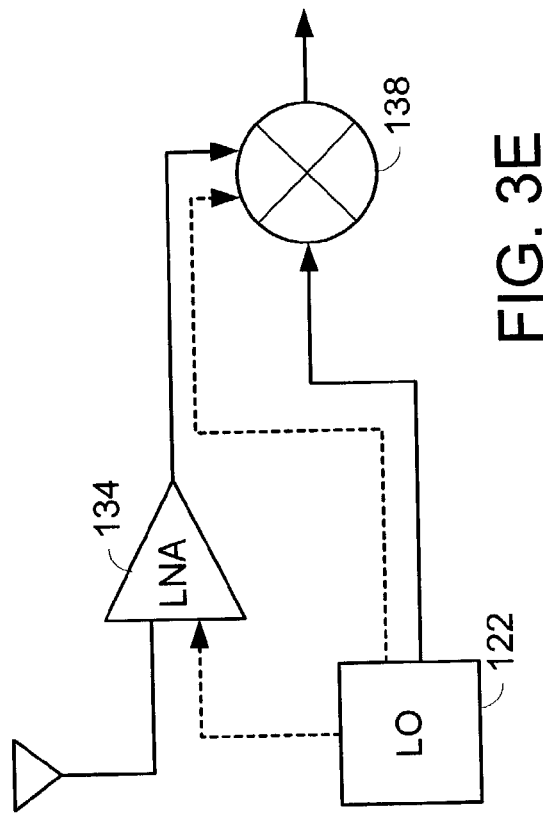
FIG. 3E is a block diagram that collectively illustrate some of the challenges that exist for developing zero IF systems that are all integrated within a semiconductor device.

FIGS. 3A, 3B, 3C and 3D are frequency response curves and FIG. 3E is a block diagram that collectively illustrate some of the challenges that exist for developing zero IF systems that are all integrated within a semiconductor device. Referring now to FIG. 3A, a signal is transmitted over a wireless medium as an RF signal shown generally at 104. For processing by a receiver, however, that signal is first down-converted to an intermediate frequency (IF) shown generally at 108, wherein some preliminary processing occurs. Thereafter, the signal is down-converted from intermediate frequency 108 to baseband frequency 112.

The foregoing discussion about SAW filters may be considered in view of the frequency shown generally at 116. If the intermediate frequency is low enough, then the filters may be developed on-chip. As described previously, however, the image rejection of the on-chip filters is not always satisfactory. Thus, it is desirable to develop a zero IF system, meaning that no intermediate frequencies are used, as is illustrated in FIG. 3B, in order to satisfy image rejection requirements. Accordingly, received signals are transmitted directly from the RF signal 104 to the baseband frequency 112 as is shown in FIG. 3B. Similarly, signals that are to be transmitted are up-converted from baseband frequency 112 to RF signal 104.

One problem with down-converting signals directly from RF signal 104 to baseband frequency 112 is that the process of down-converting the signal immediately results in a DC offset 120, as is shown in FIG. 3C. Additionally, a noise component, often described as a 1/f interference, is illustrated in FIG. 3D. As may be seen, the 1/f interference is very high at low frequencies but tapers off as the frequency is increased. One problem with the DC offset and the 1/f interference is that any amplification of the received signal includes amplification of interference and/or DC power from the DC offset thereby saturating the amplifier with signals other than the received or target signal.

FIG. 3E further illustrates the process that generates most of the DC offset. For example, a local oscillator (LO) 122 often produces leakage current that is conducted into the input of an amplifier or a mixer. More specifically, as may be seen in FIG. 3E, the LO 122 has leakage current that is conducted into the input of low noise amplifier (LNA) 134 and the input of mixer 138. This type of self mixing produces the most of DC offset at the output of the mixer 138. It is very important, therefore, to eliminate these leakage currents so that the DC offset is at a minimum level.

FIGS. 4A and 4B illustrate frequency response curves that are realized by the present inventive system or transceiver. Referring now to FIG. 4A, a DC offset is shown at 124, while the low end of a received signal frequency is shown at 128. FIG. 4B illustrates a high pass (HP) filter 135 that eliminates the DC offset 124 and a low pass (LP) filter 131 that selects the desired signal channel by attenuating higher frequency interference. If a cheap reference crystal is used as specified by at least some wireless communication standards, the local oscillation signal frequency has a limited accuracy. Because an inaccurate reference signal could affect the mixing results in a down-conversion module such as down-conversion module 70, the received signal could be down-converted too low and could be partially attenuated by the HP filter 135. It could also be down-converted too high and could be attenuated by the LP filter 131. In order to avoid signal degradation, automatic frequency control (AFC) is implemented as shown in FIG. 4A. Accordingly, the invention includes a transceiver that determines the difference between frequency 126 and ideal frequency 128 (as shown in FIG. 4B) and adjusts LO frequency so that the low end of the received signal is located at 128 and the high end of the signal is located at 132.

FIG. 4B further illustrates that the down-converted signal after LO frequency correction is located in the desired frequency range, wherein the low end of the frequency is at 128 and the high end is at 132. As may be seen, the channel for the received signal now ranges from the frequency shown at 128 to the frequency shown at 132. Moreover, FIG. 4B shows a high pass filter frequency response curve 135. As may be seen, the channel of the received signal is well beyond the attenuation part of HP filter curve 135. Without adjusting the frequency of LO, the high pass filter, whose frequency response curve is shown in FIG. 4B, would have filtered or eliminated some of the received signal thereby losing information. Thus, FIGS. 4A and 4B suggest that the inventive system includes circuitry for not only correcting LO frequency, but also to filter the received signal thereafter with a high pass filter and a low pass filter.

Figure 5:
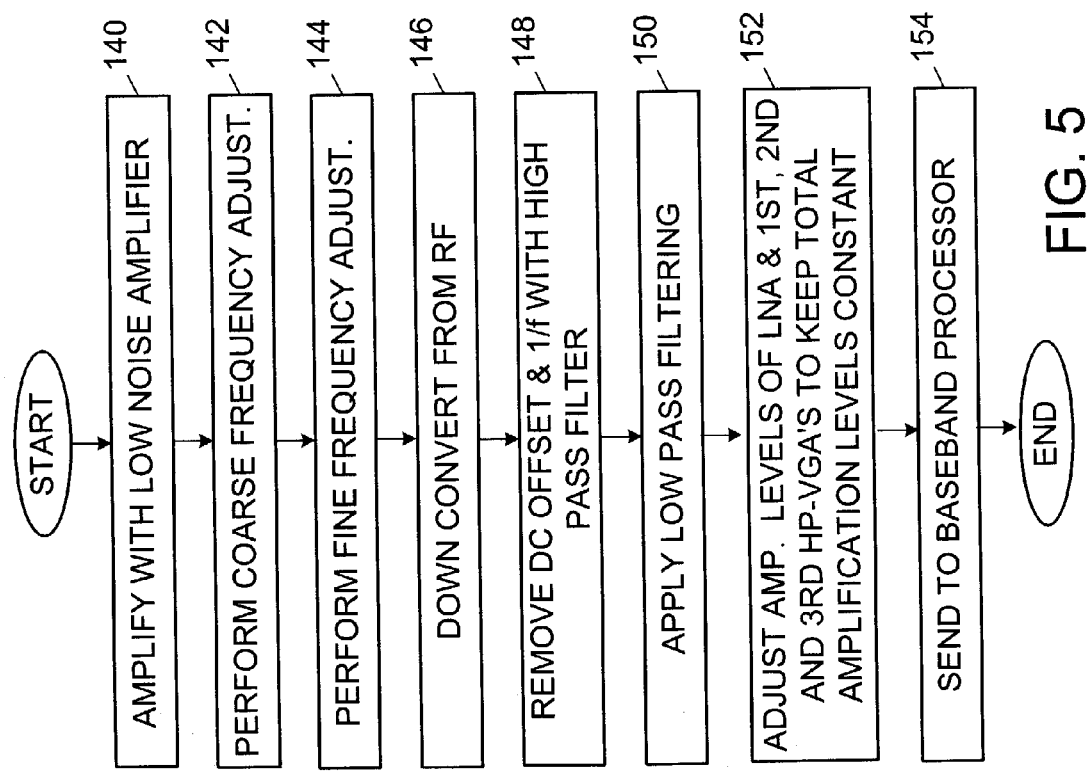
FIG. 5 is a flowchart that illustrates an overall method performed by the inventive transceiver according to one embodiment of the present invention.

FIG. 5 is a flowchart that illustrates an overall method performed by the inventive transceiver according to one embodiment of the present invention. Referring now to FIG. 5, a first process step taken by the transceiver is to amplify a received RF signal with a low noise amplifier (step 140). Thereafter, the frequency of the received and amplified RF signal is adjusted by a local oscillation signal frequency compensated with an automatic frequency control circuitry. In the described embodiment, a coarse adjustment is made with an uncompensated local oscillation signal (step 142). Thereafter, a fine adjustment is determined, in the digital domain, by compensating the LO signal by a frequency shift (step 144). Thereafter, the signal is down-converted from a specified RF channel to a specified baseband channel (step 146). A DC offset and any low frequency interference (e.g., 1/f) are removed with at least one high pass filter tuned to pass the baseband channel (step 148). A low pass filter is applied to eliminate interference occurring above the channel (step 150). Finally, the signals are amplified by a plurality of amplifiers (step 152). The amplification level of the amplifiers is adjusted in an inverse proportional manner according to interference levels so that total amplification remains constant. Finally, the amplified signals are produced to the baseband processor (step 154).

Figure 6:
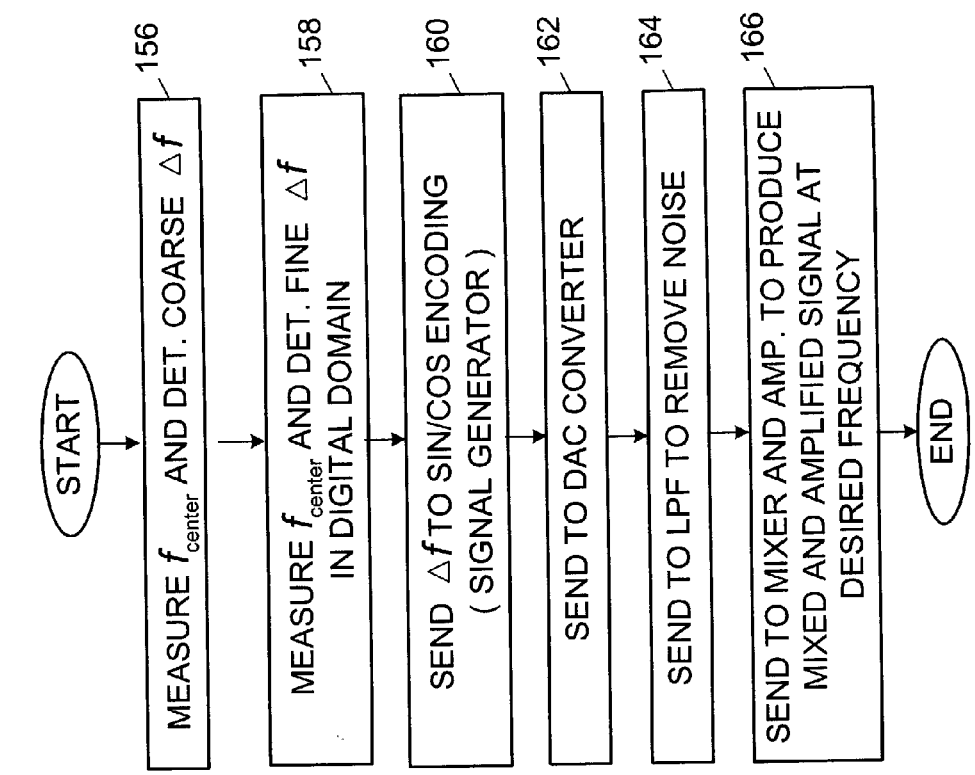
FIG. 6 is a flowchart that illustrates a method for adjusting the channel frequency to a desired channel frequency according to one embodiment of the present invention.

FIG. 6 is a flowchart that illustrates a method for adjusting the channel frequency to a desired channel frequency according to one embodiment of the present invention. Referring now to FIG. 6, the inventive method includes initially measuring a center frequency for the received RF signal and determining the difference between that center frequency and the center frequency of a specified RF channel (step 156). Initially, a coarse difference is measured and is corrected by adjusting LO frequency. Then, the residual difference is adjusted to a fine degree of measurement in the digital domain to obtain an accurate difference between an actual center frequency and a specified center frequency (step 158). The difference in center frequencies is then transmitted to a signal generator (step 160). In the described embodiment of the invention, the signal generator for the transceiver is the one that is capable of performing quadrature phase shift keyed modulation of signals. Accordingly, the difference in center frequency values determined in step 156 is transmitted to a sine and a cosine element of an encoder or signal generator.

After the difference in frequency has been sent to the sine/cosine encoders, the signals are transmitted from the encoders to a digital-to-analog converters (step 162). Thereafter, the digital-to-analog converter transmits the signals to a low pass filter to remove high frequency interference (step 164). Thereafter, the signal is transmitted to a mixer to produce a new local oscillator signal output. The new local oscillator output signal is characterized by the desired frequency channel (step 166).

FIG. 7 is a flowchart that illustrates a method for amplifying a received signal in a transceiver according to one embodiment of the present invention. The method of FIG. 7 generally includes using a plurality of received signal strength indicators (RSSI) to sense the power of the received interference and signal to determine an amplification level of cascaded amplifier stages. Initially, a first RSSI is used to sense the power of the received interference and signal (step 170). Thereafter, a second RSSI is used to sense the power of the signal without the interference (step 172). After measuring the power of the signal, as well as the power of the interference and signal, the transceiver evaluates the ratio of signal power to signal and interference power to determine optimal amplification techniques by each of a plurality of amplifiers (step 174). If the interference level is high, the gain of a first amplifier is set to a lower value and the rear gain of a second amplifier, which is located after channel selection filter, is set to a higher value in a multi-amplifier system (step 176). If the interference value is relatively low, the frontal gain is set to a higher value and the rear gain is set to a lower value (step 178). The gain of the front and rear amplifiers are adjusted in a manner wherein the total amplification is kept at a constant level required for certain input power level of the desired channel or signal (step 180). In the described embodiment, an LNA is used for the front end and three high pass variable gain amplifiers (HP-VGA's) are used in subsequent stages.

Figure 8:
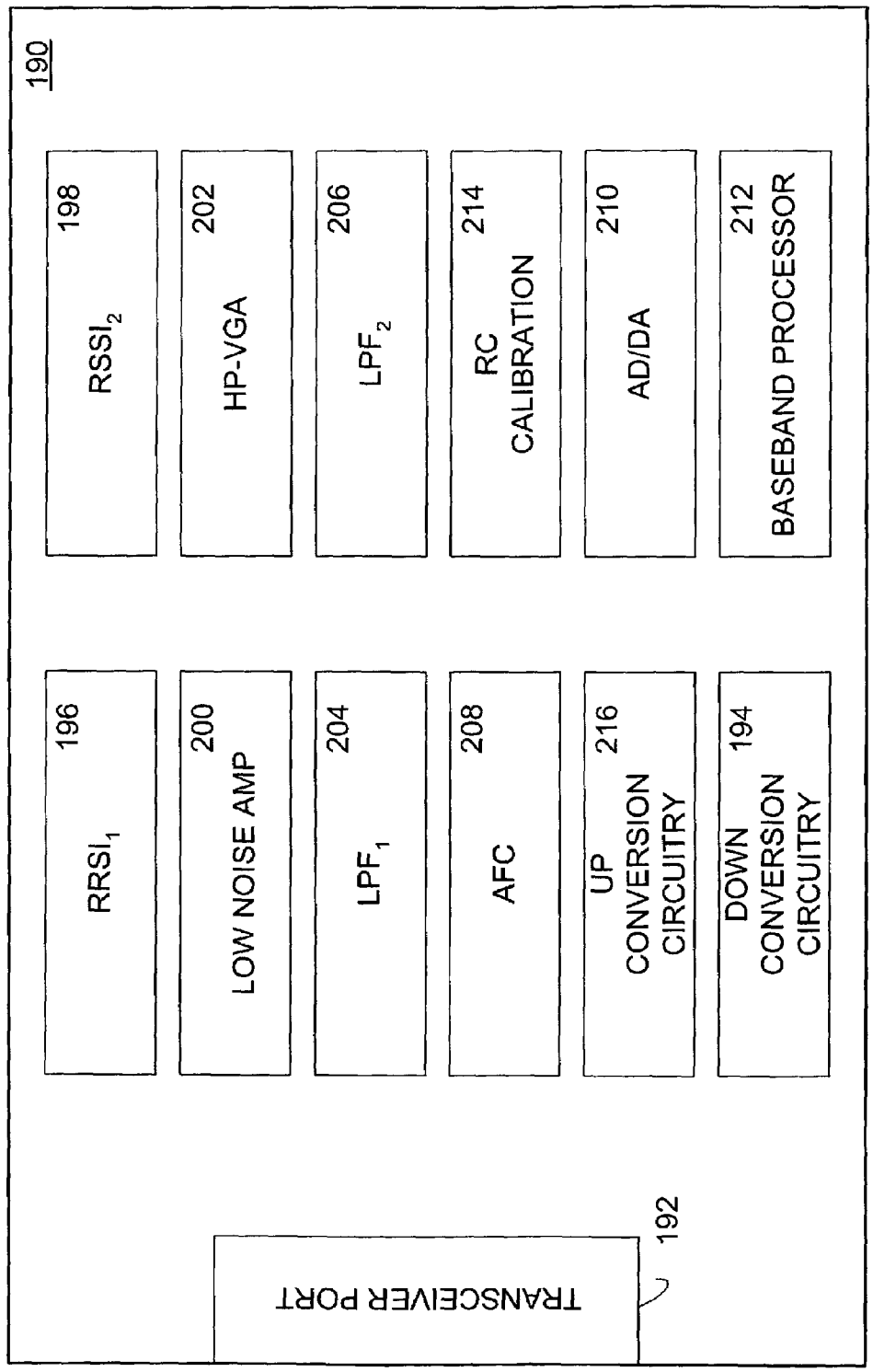
FIG. 8 is a functional block diagram of a transceiver formed according to one embodiment of the present invention.

FIG. 8 is a functional blocks of a transceiver formed according to one embodiment of the present invention. Referring now to FIG. 8, a transceiver 190 includes a transceiver port 192 for receiving and transmitting communication signals. In the described embodiment of the invention, transceiver port 192 receives signals transmitted at the RF and generates signals that are transmitted externally at the RF.

In addition to transceiver port 192, transceiver 190 further includes a plurality of RSSI's 196 and 198 that are for sensing the power level of the received signals and, more particularly, of the received signal as well as the received signal and interference. Further, a low noise amplifier (LNA) 200 and few high pass variable gain amplifiers (HP-VGA's) 202 provide amplification for a signal as it is being processed. Transceiver 190 further includes a pair of low pass filters 204 and 206 and an automatic frequency control (AFC) circuit 208. Automatic frequency control circuit 208 is for adjusting the LO signal frequency in transceiver 190 to align the received RF with the desired frequency channel. In the described embodiment, AFC circuit 208 adjusts the frequency of the LO signal frequency so that the received signal is located within the un-attenuated part of HP and LP filters. Transceiver 190 further comprises analog-to-digital and digital-to-analog conversion (ADC/DAC) circuitry 210 that is for converting signal formats as required. Additionally, transceiver 190 includes a baseband processor 212 that is for processing the received signal and the signal to transmit. An RC calibration circuit 214 is coupled to receive control commands from the baseband processor 212 to vary RC time constants of various filters among other circuits as is known by one of average skills in the art. Transceiver 190 further includes up-conversion circuitry 216 that receives signals that are to be transmitted that originated from baseband processor 212 and then up-converts the baseband signals to the RF for transmission from transceiver port 192. Finally, transceiver 190 includes down-conversion circuitry 194 for converting received RF signals to baseband frequencies.

In operation, transceiver port 192 receives RF signals and converts the signals from the RF to baseband. The down-conversion is performed by down-conversion circuitry 194 of FIG. 8. Once the signal has been down-converted, the RSSI's 196 and 198 sense the power of the signal, as well as the signal plus interference, to determine the manner in which the amplification stages should be set for the received signal. While transceiver 190 shows the pair of low pass filters 204 and 206 which are used as a part of filtering higher frequency interference during the down-conversion process as well as during the automatic frequency control or adjustment process by AFC 208, it is understood that transceiver 190 may include more than or less than two low pass filters. In general, the pair of low pass filters 204 and 206 represent the low pass filtering that occurs during the down-conversion process as well as during the automatic frequency control process to adjust the frequency of the received signals. Thus, in addition to sensing the power levels of the signal and interference of the received signal, the frequency is adjusted by AFC 208 at which time it is filtered by the high pass filter to remove DC offset and the 1/f interference. After the low frequency interference has been removed, as well as the high frequency interference from the various filters, the signal is amplified and converted into digital domain for processing by the baseband processor. The signal is amplified by LNA 200 and HP-VGA's 202, which total amplification is kept at a constant value (for a certain input power level of the received signal) but which individual amplification is either increased or decreased according to the signal and signal plus interference ratios described earlier.

Figure 9:
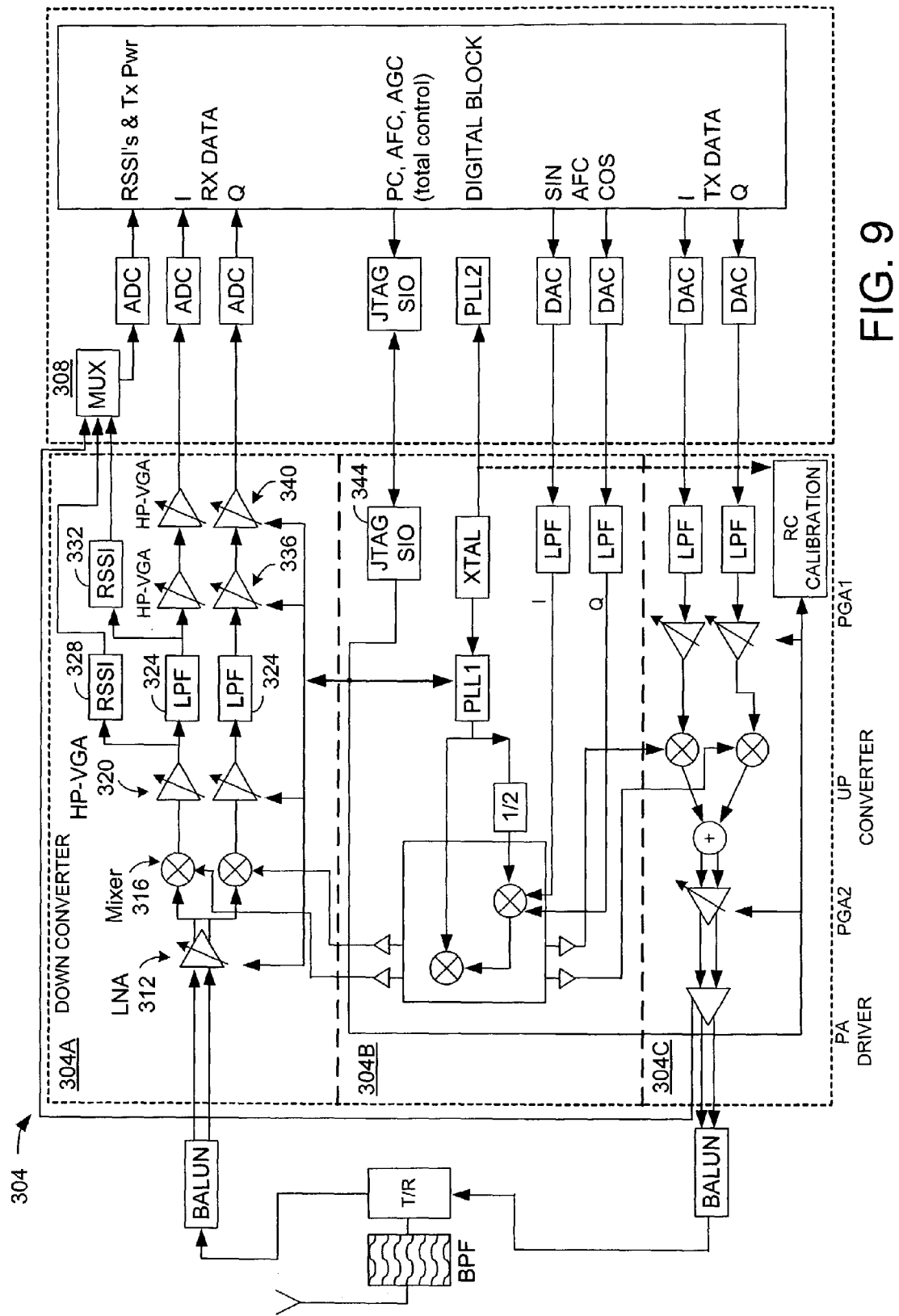
FIG. 9 is a functional schematic diagram of a transceiver formed according to one embodiment of the present invention.

FIG. 9 is a functional schematic diagram of a direct conversion radio transceiver formed according to one embodiment of the present invention. Referring now to FIG. 9, a transceiver system comprises radio circuitry 304 that is coupled to baseband processing circuitry 308. The radio circuitry 304 performs filtering, amplification, frequency calibration (in part) and frequency conversion (down from the RF to baseband and up from baseband to the RF). Baseband processing circuitry 308 performs the traditional digital signal processing in addition to partially performing the automatic frequency control. As may be seen, the single chip radio circuitry 304 is coupled to receive radio signals that are initially received by the transceiver and then converted by a Balun signal converter, which performs single end to differential conversion for the receiver (and differential to single end conversion for the transmitter end). The Balun signal converters are shown to be off chip-in FIG. 9, but they may be formed on-chip with radio circuitry 304 as well. Similarly, while the baseband processing circuitry 308 is shown off-chip, it also may be formed on-chip with radio circuitry 304.

Radio circuitry 304 and, more particularly, circuitry portion 304A, includes a low noise amplifier 312 that is coupled to receive RF signals from a transceiver port. The low noise amplifier 312 then produces an amplified signal to mixers 316 that are for adjusting and mixing the RF with a local oscillation signal. The outputs of the mixers 316 (I and Q components of quadrature phase shift keyed signals) are then produced to a first HP-VGA 320.

The outputs of the first HP-VGA 320 are then produced to a first RSSI 328 as well as to a low pass filter 324. The outputs of the low pass filter 324 are then produced to a second RSSI 332, as well as to a second HP-VGA 336 and a third HP-VGA 340 as may be seen in FIG. 9.

In operation, the first RSSI 328 measures the power level of the signal and interference. The second RSSI 332 measures the power level of the signal only. The baseband processing circuitry 308 then determines the ratio of the RSSI measured power levels to determine the relative gain level adjustments of the front and rear amplification stages.

In the described embodiment of the invention, if the power level of the signal and interference is approximately equal to or slightly greater than the power level of the signal alone, then the first amplification stages are set to a high value and the second amplification stages are set to a low value. Conversely, if the power level of the signal and interference is significantly greater than the power of the signal alone, thereby indicating significant interference levels, the first amplification stages are lowered and the second amplification stages are increased proportionately.

Circuitry portion 304B includes low pass filters for filtering I and Q component frequency correction signals and mixer circuitry for actually adjusting LO signal frequency. The operation of mixers and phase locked loop for adjusting frequencies is known. Circuitry portion 304B further includes JTAG (Joint Test Action Group, IEEE1149.1 boundary-scan standard) serial interface (SIO) circuitry 344 for transmitting control signals and information to circuitry portion 304A (e.g., to control amplification levels) and to a circuitry portion 304C (e.g., to control or specify the desired frequency for the automatic frequency control).

A portion of the automatic frequency control circuitry that determines the difference in frequency between a specified center channel frequency and an actual center channel frequency for a received RF signal is formed within the baseband circuitry in the described embodiment of the invention. This portion of the circuitry includes circuitry that coarsely measures the frequency difference and then measures the frequency difference in the digital domain to obtain a more precise measurement and to produce frequency correction inputs to circuitry portion 304B.

Finally, radio circuitry portion 304C includes low pass filtration circuitry for removing any interference that is present after baseband processing as well as amplification, mixer and up-converter circuitry for preparing a baseband signal for transmission at the RF.

Figure 10:
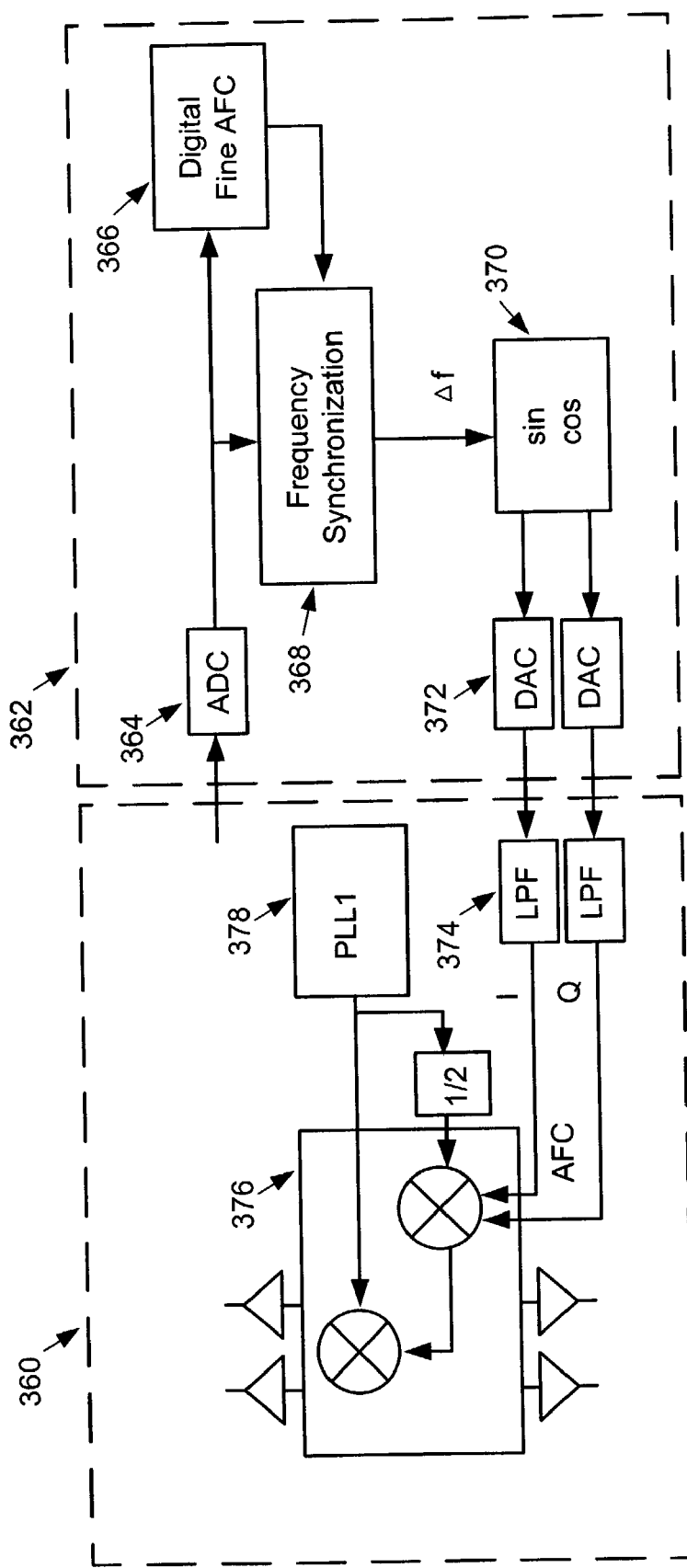
FIG. 10 is a functional schematic diagram of an automatic frequency control (AFC) circuit formed according to one described embodiment of the invention.

FIG. 10 is a functional schematic diagram of an automatic frequency control (AFC) circuit formed according to one described embodiment of the invention. The AFC circuit of FIG. 10 comprises an RF signal processing portion 360 and a baseband signal processing portion 362. Generally, portion 360 is for adjusting an LO signal frequency. Portion 362 is for determining the difference in center channel frequencies between the received RF and the expected frequency value for the received signal.

An analog-to-digital converter (ADC) 364 is used to convert the received signal from analog to digital. ADC 364 is coupled to receive an RF signal that has been down-converted to produce a digitally converted signal to frequency synchronization circuitry 368 that measures the frequency difference in a coarse degree of resolution. Digital frequency control circuitry 366 performs its measurements and calibration in the digital domain and provides its results to frequency synchronization circuitry 368 to adjust the frequency difference of frequency synchronization circuitry 368 with a fine degree of resolution.

Frequency synchronization circuitry 368, as a part of determining the difference in center channel frequency for the received signal and an expected value, receives and interprets a pilot signal that defines the expected center channel frequency. Accordingly, after measuring the actual center channel frequency of the received RF, frequency synchronization circuitry 368 is able to determine the frequency difference. Frequency synchronization circuitry 368 then produces a signal defining the difference in center channel frequency for the received signal and an expected value to a signal generator 370. It is understood that the pilot channel is transmitted as a part of standard wireless network communication protocols for signal control and synchronization purposes.

Signal generator 370, upon receiving the difference in center channel frequency for the received signal and an expected value, produces quadrature phase shift keyed (I & Q) outputs for the received frequency difference (reflecting a frequency adjustment amount) to a pair of digital-to-analog converters (DAC's) 372. The analog outputs of the pair of DAC's 372 are then passed to low pass filters 374 and are then up-converted to the RF. The I and Q RRF signal components are then produced to mixer circuitry 376 that also receives a specified input from phase locked loop circuitry 378 to produce a received RF having a specified center channel frequency. It is understood that mixer circuitry 376 (including PLL circuitry 378) further receives control signals from baseband processing circuitry (not shown in FIG. 10) specifying the expected center channel frequency that is specified in the aforementioned pilot channel.

FIG. 11 is a functional schematic block diagram of a frequency correction stage formed according to one embodiment of the present invention. The frequency correction stage of FIG. 11 generally comprises an I component frequency corrected mixer module and a Q component frequency corrected mixer module. The structure of the I and Q component frequency corrected mixer modules is similar, though the inputs to a plurality of mixers of the I and Q component frequency corrected mixer modules are coupled differently. The I and Q component frequency corrected mixer modules each comprise first and second mixing stages that further comprise mixers there within. For example, the first mixing stage of the I component frequency corrected mixer module comprises a first I component mixer that is coupled to receive a divided phase locked loop oscillation signal and a frequency correction input for an I component. The output of the first I component mixer is equal to:

½ cos(x+y)−½ cos(x−y)

wherein a sine wave is used to represent an I component signal and a cosine wave is used to represent a Q component signal. The first mixing stage of the I component frequency corrected mixer module further includes a second I component mixer which is coupled to receive a local oscillation signal and a frequency correction input for a Q component. The output of the second I component mixer is equal to:

½ cos(x+y)+½ cos(x−y)

The outputs of the first and second I component mixers are then produced to a first adder wherein the four component terms are summed to produce an output that is equal to cos(x+y). The first adder output is then produced to the second mixing stage of the I component frequency corrected mixer module and, more specifically, to an I component output mixer that is further coupled to receive an uncompensated local oscillation signal. The I component output mixer, upon mixing the input received from the first adder with the uncompensated local oscillation signal, produces an RF local oscillation frequency corrected output I component signal.

Similarly, the Q component frequency corrected mixer module comprises first and second mixing stages. The first mixing stage includes a first Q component mixer and a second Q component mixer. The first Q component mixer receives a Q component local oscillation signal and an I component frequency correction input. The second Q component mixer receives an I component local oscillation signal and a Q component frequency correction input. The output of the first Q component mixer is equal to:

½ sin(x+y)−½ sin(x−y).

The output of the second Q component mixer is equal to:

½ sin(x+y)+½ sin(x−y)

The outputs of the first and second Q component mixers are then produced to a second adder that sums the received outputs from the first and second Q component mixers to produce an output that is equal to sin(x+y). The output of the second adder is then produced to the second mixing stage of the Q component frequency corrected mixer module and, more specifically, to a Q component output mixer. The Q component output mixer further is coupled to receive the uncompensated local oscillation signal which is mixed with the Q component frequency corrected input received from the second adder. The Q component output mixer then produces the RF local oscillation frequency corrected output Q component signal.

The frequency correction stage, more generally, is coupled to receive I and Q component frequency correction inputs that are to be mixed with I and Q component phase locked loop oscillation signals. In one embodiment of the present invention, the phased locked loop oscillation signals that are received in the first mixing stage are divided by a factor, for example, 2, for reasons that assist with overall operation of the circuit (e.g., to avoid "pulling" by the local oscillator). The present circuit receives a divided local oscillation signal so that, when mixed with the uncompensated local oscillation signal, an output signal of a desired frequency is produced as the RF local oscillation frequency corrected signal. More specifically, if the uncompensated local oscillation signal is equal to ⅔ of a desired output frequency, and that signal is mixed with a divided local oscillation signal that is divided by 2, then the output signal will have a frequency that is equal to the sum of the uncompensated local oscillation signal and the divided local oscillation signal.

Figure 12:
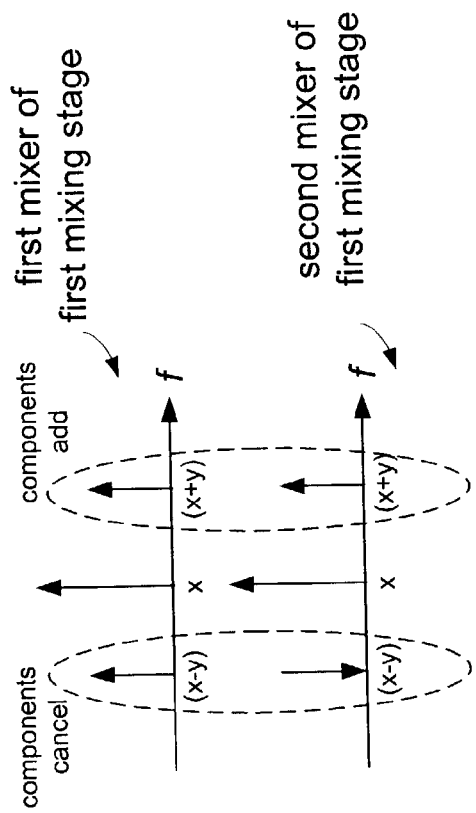
FIG. 12 is a diagram that illustrates the operation of the first mixing stage according to one embodiment of the present invention.

FIG. 12 is a diagram that illustrates the operation of a first mixing stage according to one embodiment of the present invention. As may be seen, a horizontal axis represents frequency while a vertical axis represents a signal having a magnitude at a specified frequency. A group of signals for the top portion of the diagram represent the output signals from a first mixer of the first mixing stage, while the signals in the bottom half of the diagram illustrate the output signals of a second mixer of the first mixing stage. More specifically, the signals shown at the center of each horizontal frequency axis represents frequency "x". To the left of frequency "x", the signals represent the frequency at (x−y). To the right of the center frequency, the signals represent the frequency of (x+y).

The direction of the arrows for each of the signals represents the signal magnitude. Thus, as may be seen, the signals at the frequency (x+y) are both positive and are therefore additive. On the other hand, the signals at the frequency (x−y) are opposite in magnitude thereby canceling each other out when summed with each other.

Figure 13:
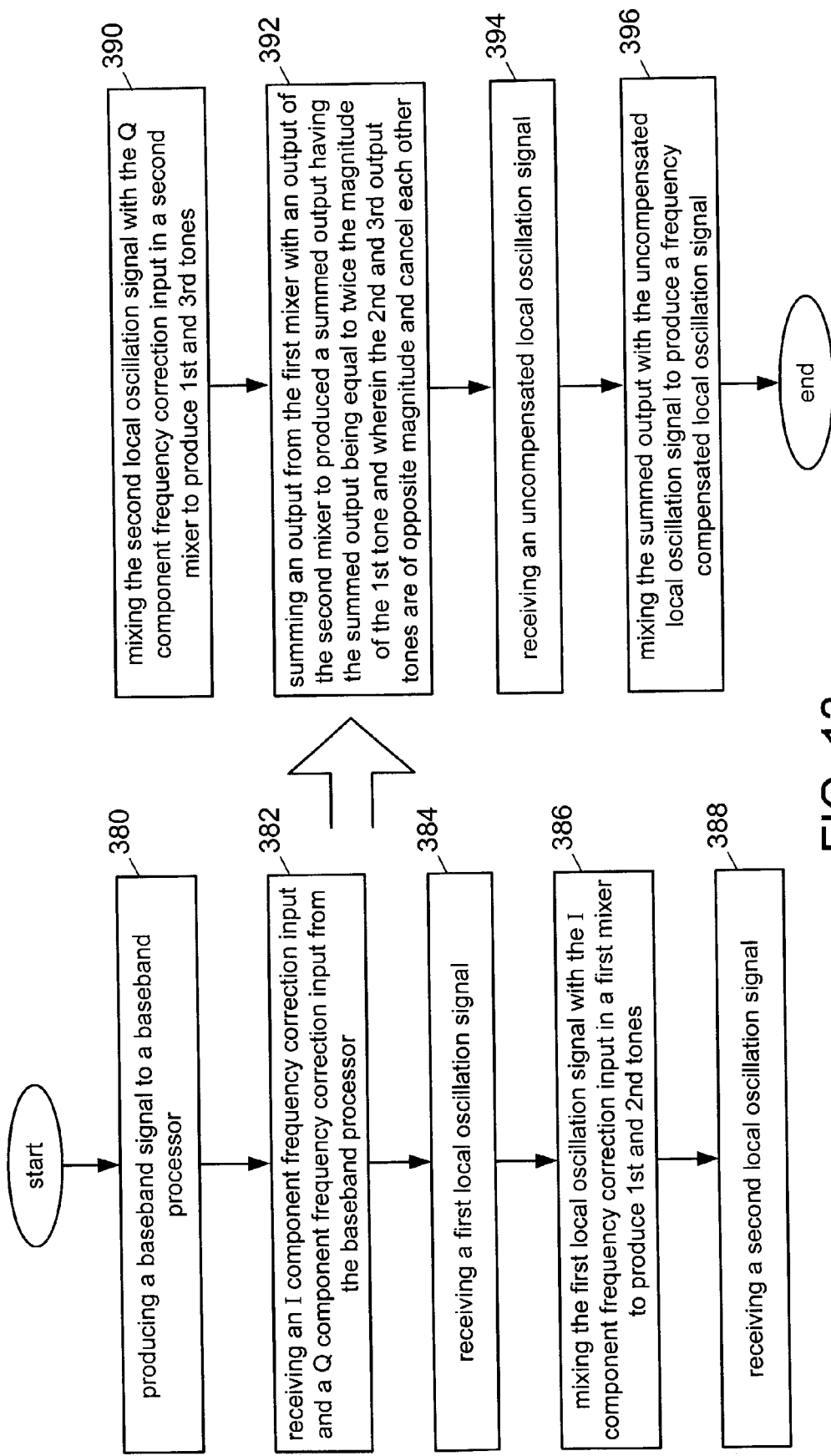
FIG. 13 is a flowchart illustrating a method for producing a frequency compensated local oscillation signal for mixing with an RF signal or with a baseband or low intermediate frequency signal for down-converting or up-converting, respectively.

FIG. 13 is a flowchart illustrating a method for producing a frequency compensated local oscillation signal for mixing with an RF signal or with a baseband or low intermediate frequency signal for down-converting or up-converting, respectively. Initially, an RF signal is received in a receiver that is produced to a mixer for down-conversion with an uncompensated local oscillation signal. The down-converted baseband signal is then produced to a baseband processor (step 380). The baseband processor thereafter determines an amount of frequency correction that is necessary for the I and Q components of the received RF. Accordingly, in a frequency correction stage, the invention includes receiving an I component frequency correction input and a Q component frequency correction input from the baseband processor (step 382). The frequency correction stage further receives a first local oscillation signal (step 384) and mixes the first local oscillation signal with the I component frequency correction input in a first mixer to produce first and second tones (step 386). A second local oscillation signal also is received (step 388) and is mixed with the Q component frequency correction input in a second mixer to produce first and third tones (step 390). The outputs of the first and second mixers are then received by an adder and are summed to produce a summed output (step 392). The summed output is equal to twice the magnitude of the first tone wherein the second and third output tones are of opposite magnitude and cancel each other. The output of the adder is then produced to a second mixing stage. The second mixing stage then receives an uncompensated local oscillation signal (step 394) and thereafter mixes the summed output with the uncompensated local oscillation signal to produce a frequency corrected local oscillation signal (step 396).

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. A direct conversion Radio Frequency (RF) transceiver integrated circuit comprising:
    a local oscillator that generates an RF local oscillation signal corresponding to an RF channel;
    a receiver section operably coupled to the local oscillator to receive the RF local oscillation signal, wherein the receiver section receives an incoming RF signal, and wherein the receiver section down-converts the incoming RF signal based upon the RF local oscillation signal to produce an incoming baseband signal;
    a transmitter section operably coupled to the local oscillator to receive the RF local oscillation signal, wherein the transmitter section receives an outgoing baseband signal, and wherein the transmitter section up-converts the outgoing baseband signal to produce an outgoing RF signal; and
    wherein the local oscillator further comprises:
        a first mixing stage comprising a frequency correcting stage that receives a frequency correction input and the uncompensated local oscillation signal having a reduced magnitude to produce a frequency correction component; and
        a second mixing stage coupled to receive an uncompensated local oscillation and the frequency correction component output from the first mixing stage wherein the frequency correcting stage adjusts the uncompensated local oscillation signal based upon the frequency correction input to produce the RF local oscillation signal.

2. The RF transceiver integrated circuit of claim 1, wherein the local oscillator further comprises a phase locked loop that generates the uncompensated local oscillation signal.

3. The RF transceiver integrated circuit of claim 1, wherein the local oscillator further comprises:
    a phase locked loop that generates a phase locked loop oscillation signal;
    a divider circuit that receives the phase locked loop oscillation signal to produce a divided phase locked loop oscillation signal; and
    a mixer that mixes the phase locked loop oscillation signal with the divided phase locked loop oscillation signal to produce the uncompensated local oscillation signal.

4. The RF transceiver integrated circuit of claim 1, wherein the local oscillator further comprises:
    a phase locked loop that generates a phase locked loop oscillation signal;
    a divider circuit that receives the phase locked loop oscillation signal to produce a divided phase locked loop oscillation signal;
    wherein the first mixing stage that mixes the divided phase locked loop oscillation signal with the frequency correction input to produce an intermediate stage corrected oscillation signal; and
    wherein the second mixing stage that mixes the intermediate stage corrected oscillation signal with the phase locked loop oscillation signal to produce the RF local oscillation signal.

5. The RF transceiver integrated circuit of claim 4, wherein the first and second mixing stages include circuitry that form an an in-phase (I) component frequency correction module and a quadrature phase (Q) component frequency correction module that produce frequency corrected I and Q component oscillation signals, respectively.

6. The RF transceiver integrated circuit of claim 5 wherein the I component frequency correction module comprises first and second I component mixers in the first mixing stage and an adder that sums the outputs of the first and second I component mixers.

7. The RF transceiver integrated circuit of claim 6 wherein the I component frequency correction module comprises an I component output mixer in the second mixing stage that is coupled to receive a summed output from the adder and the uncompensated local oscillation signal.

8. The RF transceiver integrated circuit of claim 5 wherein the Q component frequency correction module comprises first and second Q component mixers in the first mixing stage and an adder that sums the outputs of the first and second Q component mixers.

9. The RF transceiver integrated circuit of claim 8 wherein the Q component frequency correction module comprises a Q component output mixer in the second mixing stage that is coupled to receive a summed output from the adder and the uncompensated local oscillation signal.

10. The RF transceiver integrated circuit of claim 1, wherein the frequency correction input is received from a coupled baseband processor.

11. The RF transceiver integrated circuit of claim 1, further comprising a baseband processor, wherein:
    the baseband processor is coupled to receive the incoming baseband signal;
    the baseband processor determines the frequency correction input from the incoming baseband signal; and the baseband processor provides the frequency correction input to the local oscillator.

12. In a Radio Frequency (RF) transceiver mixer module, a method for down-converting a received RF signal, comprising:
producing a baseband signal to a baseband processor;
receiving an I component frequency correction input and a Q component frequency correction input from the baseband processor;
receiving a first local oscillation signal;
mixing the first local oscillation signal with the I component frequency correction input in a first mixer;
receiving a second local oscillation signal;
mixing the second local oscillation signal with the Q component frequency correction input in a second mixer;
summing an output from the first mixer with an output of the second mixer to produced a summed output;
receiving an uncompensated local oscillation signal;
mixing the summed output with the uncompensated local oscillation signal to produce a compensated local oscillation signal; and
mixing the compensated local oscillation signal with the received RF signal to produce the baseband signal.

13. The method of claim 12 wherein the, step of mixing the first local oscillation signal with the I component frequency correction input in the first mixer produces first and second output tones.

14. The method of claim 13 wherein the step of mixing the second local oscillation signal with the Q component frequency correction signal in the second mixer produces first and third output tones.

15. The method of claim 14 wherein the summed output includes a signal having twice the magnitude of the first output tone and wherein the second and third output tones are of opposite magnitude and cancel each other.

16. A direct conversion Radio Frequency (RF) transceiver integrated circuit comprising:
a mixer module that generates I and Q component frequency corrected local oscillation signals corresponding to an RF channel;
a receiver section operably coupled to receive the I and Q component frequency corrected local oscillation signals and coupled to receive an incoming RF signal, wherein the receiver section down-converts the incoming RF signal based upon the I and Q component frequency corrected local oscillation signals to produce incoming I and Q baseband signal components;
a transmitter section operably coupled to receive I and Q component frequency corrected local oscillation signals and coupled to receive I and Q components of an outgoing baseband signal, wherein the transmitter section up-converts the I and Q components of the outgoing baseband signal and produces an outgoing RF signal; and
wherein the mixer module further includes:
a first mixing stage coupled to receive first and second local oscillation signals and first and second frequency correction components;
at least one adder within the first mixing stage and coupled to receive a plurality of outputs from a plurality of mixers of the first mixing stage; and
a second mixing coupled to receive an uncompensated local oscillation signal and at least one summed output from the one adder, the second mixing stage for producing the I and Q component frequency corrected local oscillation signals.

17. The direct conversion RF transceiver integrated circuit of claim 16 wherein the first mixing stage comprises first and second mixers, the first mixer coupled to receive an I component frequency correction input and the first local oscillation signal.

18. The direct conversion RF transceiver integrated circuit of claim 17 wherein the second mixer of the first mixing stage is coupled to receive a Q component frequency correction input and the second local oscillation signal.

19. The direct conversion RF transceiver integrated circuit of claim 16 wherein the first mixing stage comprises third and fourth mixers, the third mixer coupled to receive an I component frequency correction input and the second local oscillation signal.

20. The direct conversion RF transceiver integrated circuit of claim 19 wherein the fourth mixer of the first mixing stage is coupled to receive a Q component frequency correction input and the first local oscillation signal.

21. The mixer module of claim 16 wherein the at least one adder comprises first and second adders, the first adder coupled to receive mixed outputs from the first and second mixers to produce a first summed output.

22. The direct conversion RF transceiver integrated circuit of claim 19 wherein the second adder is coupled to receive mixed outputs from the third and fourth mixers to produce a second summed output.

23. The direct conversion RF transceiver integrated circuit of claim 21 wherein the second mixing stage comprises fifth and sixth mixers, the fifth mixer coupled to receive the first summed output and the uncompensated local oscillation signal, the fifth mixer producing a I component frequency corrected local oscillation signal.

24. The direct conversion RF transceiver integrated circuit of claim 23 wherein the sixth mixer is coupled to receive the second summed output and the uncompensated local oscillation signal, the sixth mixer producing a Q component frequency corrected local oscillation signal.

25. A direct conversion Radio Frequency (RF) transceiver integrated circuit, comprising:
local oscillator means for generating an RF local oscillation signal corresponding to an RF channel;
receiver means operably coupled to the local oscillator means to receive the RF local oscillation signal and that receives an incoming RF signal, the receiver means also for down-converting the incoming RF signal based upon the RF local oscillation signal to produce an incoming baseband signal;
transmitter means operably coupled to the local oscillator and to receive an outgoing baseband signal and up-converts the outgoing baseband signal, the transmitter means for producing an outgoing RF signal; and
wherein the local oscillator means further comprises:
frequency correcting means that receives a frequency correction input and a divided local oscillation signal, the frequency correcting means for producing a frequency compensated local oscillation signal component based upon the frequency correction input;
a phase locked loop that generates the phased locked loop oscillation signal as the local oscillation signal;
a divider circuit that receives the phased locked loop oscillation signal to produce the divided phased locked loop oscillation signal; and
a mixer that mixes the phased locked loop uncompensated oscillation signal with the frequency compensated local oscillation signal component to produce the compensated local oscillation signal, wherein the mixer further concludes:

a first mixing stage that mixes the divided phase locked loop oscillation signal with the frequency correction input to produce an intermediate stage corrected oscillation signal; and a second mixing stage that mixes the intermediate stage corrected oscillation signal with the phased locked loop oscillation signal to produce the RF signal local oscillation signal.

26. The RF transceiver integrated circuit of claim 25, wherein the local oscillator means further comprises a phase locked loop that generates the uncompensated local oscillation signal.

27. The RF transceiver integrated circuit of claim 25, wherein the first mixing stage comprises:

a pair of mixers for producing I and Q frequency corrected components; and an adder for receiving and summing the I and Q frequency corrected components.

28. The RF transceiver integrated circuit of claim 27 wherein the pair of mixers are coupled to receive a divided local oscillation signal.

29. The RF transceiver integrated circuit of claim 28 wherein the pair of mixers are coupled to receive an I component of a frequency correction input.

30. The RF transceiver integrated circuit of claim 29 wherein the pair of mixers are coupled to receive a Q component of a frequency correction input.

31. The RF transceiver integrated circuit of claim 25 wherein the second mixing stage comprises a mixer coupled to receive a frequency corrected output from the first mixing stage and coupled to receive the local oscillation signal.

32. The RF transceiver integrated circuit of claim 25, wherein the frequency correction input is received from a coupled baseband processor.

33. The RF transceiver integrated circuit of claim 25, further comprising a baseband processor, wherein:

the baseband processor is coupled to receive the incoming baseband signal;

the baseband processor determines the frequency correction input from the incoming baseband signal; and the baseband processor provides the frequency correction input to the local oscillator.

34. A radio frequency (RF) integrated circuit transceiver, comprising:

baseband processing circuitry for processing incoming baseband signals and for generating outgoing baseband signals;

first amplifier means for amplifying a received RF signal and for producing an amplified RF signal;

multi-stage mixing means for mixing the amplified RF signal to produce down-converted baseband signals with at least one frequency compensated local oscillation signal and with an uncompensated local oscillation signal;

second amplifier means for amplifying down-converted baseband signals received from the mixing means to produce incoming baseband signals to the baseband processing circuitry; and wherein the multi-stage mixing means includes first and second mixing stages, wherein the first mixing stage comprises first, second, third and fourth mixers wherein the first and third mixers are coupled to receive I component frequency correction signals and wherein the second and fourth mixers are coupled to receive Q component frequency correction signals.

35. The RF integrated circuit transceiver of claim 34 wherein the multistage mixing means includes first and second mixing stages, the first mixing stage for mixing a frequency correction input with a divided local oscillation signal.

36. The RF integrated circuit transceiver of claim 34 wherein the second stage of the multi-stage mixing means is operable to mix a summed output produced by the first stage with an uncompensated local oscillation signal.

37. The RF integrated circuit transceiver of claim 34 wherein the first mixing stage of the multi-stage mixing means is operable to mix the frequency correction input with a divided local oscillation signal to produce a plurality of additive oscillation signal components that are summed to produce a summed component.

38. The RF integrated circuit transceiver of claim 37 wherein the plurality of additive oscillation signal components comprise four additive components that, when summed, produce one summed component.

39. The RF integrated circuit transceiver of claim 37 wherein the plurality of additive oscillation signal components comprise eight additive components that, when summed, produce two summed components wherein a first summed component is an I component reference local oscillation signal and wherein a second summed component is a Q component reference local oscillation signal.

40. The RF integrated circuit transceiver of claim 34 wherein the first and fourth mixers are coupled to receive Q component divided local oscillation signals.

41. The RF integrated circuit transceiver of claim 34 wherein the second and third mixers are coupled to receive Q component divided local oscillation signals.

42. The RF integrated circuit transceiver of claim 41 further including first and second adders wherein the first adder is coupled to receive outputs from the first and second mixers to produced a first summed result and wherein the second adder is coupled to receive outputs from the third and fourth mixers to produce a second summed result and further wherein the first adder produces a cosine of a sum of the divided local oscillation signal and the I component frequency correction signal and wherein the second adder produces a sine of the divided local oscillation signal and the Q component frequency correction signal.

* * * * *